United States Patent [19]

Scoopo et al.

[11] Patent Number: 5,077,234

[45] Date of Patent: Dec. 31, 1991

[54] PLANARIZATION PROCESS UTILIZING THREE RESIST LAYERS

[75] Inventors: John P. Scoopo, Austin, Tex.; Frances P. Alvarez, Medfield; Gregory J. Grula, Charlton, both of Mass.

[73] Assignee: Digital Equipment Corporation, Maynard, Mass.

[21] Appl. No.: 545,858

[22] Filed: Jun. 29, 1990

[51] Int. Cl.$^5$ .................... H01L 21/76; H01L 21/312
[52] U.S. Cl. ........................ 437/67; 437/228; 437/229; 437/235; 437/231; 148/DIG. 50; 156/648; 156/653
[58] Field of Search .............. 437/67, 228, 229, 235, 437/61, 63, 231; 148/DIG. 50, DIG. 85; 156/648, 649, 653, 661.1

[56] References Cited

U.S. PATENT DOCUMENTS

| | | | |
|---|---|---|---|
| 4,505,025 | 3/1985 | Kurosawa et al. | 437/67 |
| 4,676,868 | 6/1987 | Riley et al. | 156/653 |
| 4,783,238 | 11/1988 | Roesner | 156/649 |
| 4,836,885 | 6/1989 | Breiten et al. | 156/653 |
| 4,876,216 | 10/1989 | Tobias et al. | 437/67 |

FOREIGN PATENT DOCUMENTS

| | | | |
|---|---|---|---|
| 0076442 | 5/1984 | Japan | 437/67 |
| 0007145 | 1/1985 | Japan | 437/67 |
| 0117753 | 6/1985 | Japan | 437/67 |

Primary Examiner—Brian E. Hearn
Assistant Examiner—Tuan Nguyen
Attorney, Agent, or Firm—Arnold, White & Durkee

[57] ABSTRACT

A planarization method utilizing three resist layers is disclosed. In a substrate where the surface geometry contains trenches or steps of constant height separated by varying distances, after a CVD oxidation layer is formed, a first resist layer (plugs) is formed in wide trenches. A second resist layer is formed on the substrate to provide a gross global planarization of the substrate, which is etched back until all of the resist is removed from the active areas. A third resist layer is then formed on the substrate to provide a near planar surface. All of the resist and CVD oxide is removed from the active areas.

10 Claims, 3 Drawing Sheets

PLANARIZATION PROCESS UTILIZING THREE RESIST LAYERS

BACKGROUND OF THE INVENTION

1. Field of the Invention

This invention relates to a method of fabricating semiconductor devices and more specifically to a planarization process for use during the fabrication of semiconductor devices.

2. Description of the Prior Art

The minimum feature size in state of the art very large scale integrated circuits ("VLSIs"), such as high density memory chips, microprocessors and the like, has shrunk to the submicron level.

These VLSIs utilize a variety of devices (transistors and other circuit elements) having different feature sizes. Some devices may have submicron feature size while the others may have much greater feature sizes. Also, shallow isolation trenches of constant height and varying widths are used to isolate individual devices. The trench widths can vary greatly. These isolation trenches are typically filled with a dielectric material, such as silicon dioxide. Several VLSI chips are fabricated on a single substrate or wafer and each wafer may require several global planarization and etch-back steps. Because of the complex topography, especially when shallow trenches of greatly varying widths are used, a problem often encountered is achieving a uniform oxide fill in those trenches which is independent of trench size and device density. For such VLSIs, topology management during fabrication has become a critical process step.

Etch-back of a resist-coated dielectric layer has commonly been used to planarize semiconductor wafers. In this technique a single film or layer of a dielectric material such as silicon dioxide is deposited over the wafer surface to be planarized. An organic film like photoresist or polyamide is then spun-on the wafer so as to planarize the entire surface of the wafer. This combination of the spun-on film and dielectric are then etched in a plasma environment that has been set to produce equal amount of etch rates for both the organic and the dielectric films. However, when the distance between features increases, this technique produces a conformal instead of a planar surface.

Another method to obtain better planarization of a silicon wafer having geometry of FIG. 1 and the like is to make the wide trench 23 look like a narrow trench by forming a first layer of photoresist only in the wide trench 2 before spinning-on a second photoresist or polyamide layer on the entire wafer. This process is described in Sheldon et al., "Application of a Two-Layer Planarization Process to VLSI Intermetal Dielectric & Trench Isolation Process," IEEE Transactions on Semiconductors Manufacturing, Vol. 1, No. 4, November, 1988. This method produces better planarization than the conventional method described above, but still is not suitable, especially when the topology includes shallow trenches of varying widths. It is highly desirable to obtain a uniform oxide fill in the trenches which is independent of the trench size and/or pattern density. The present invention, which utilizes a three-layer planarization process instead of the conventional two-layer planarization process, provides uniformly oxide-filled shallow trenches and is substantially independent of the trench sizes and pattern density.

SUMMARY OF THE INVENTION

A method for planarizing a silicon substrate having shallow trenches, at least one trench being substantially wider than the remaining trenches, is disclosed. The regions between the trenches define active regions. A dielectric layer, which substantially conforms to the surface geometry of the substrate, is formed. A first resist layer is formed in the wider trench so that it is nearly in level with the silicon dioxide surface above the active regions. A second resist layer is formed on the entire substrate, which is then uniformly etched-back only until substantially all of the resist has been removed from the active regions. A third resist layer is then formed on the substrate and an etch-back is done until all of the resist and the silicon dioxide has been removed from the active regions.

Examples of more important features of the invention thus have been summarized rather broadly in order that the detailed description thereof that follows may be better understood, and in order that the contribution to the art ma be better appreciated. There are, of course, many additional features of the invention that will be described in detail hereinafter and which will form the subject of the claims appended thereto.

BRIEF DESCRIPTION OF THE DRAWINGS

For detailed understanding of the present invention, references should be made to the following detailed description of the preferred embodiment taken in conjunction with the accompanying drawings in which like elements have been given like reference numerals, and wherein.

DESCRIPTION OF THE PREFERRED EMBODIMENT

A three-layer planarization method to obtain a planar substrate which is substantially independent of the substrate surface geometry or the chip density is described.

The method of this invention is described in the context of forming dielectric filled planar shallow isolation trenches of varying widths in a silicon substrate by way of example only. It will, however, be apparent to one skilled in the art that the present invention is in no way limited to the specific embodiment of FIGS. 1-8, but is equally applicable to any substrate surface geometry which has regions of a near constant height that are separated by same or different lateral distances. It should also be noted that the starting surface geometry of a silicon substrate which is to be planarized could be at any one of a number of different stages during the wafer fabrication process. The regions could represent active areas as described herein or islands separated by isolation channels or they could represent metal lines needing interlevel dielectric so that subsequent metal could be patterned.

Figure 1:
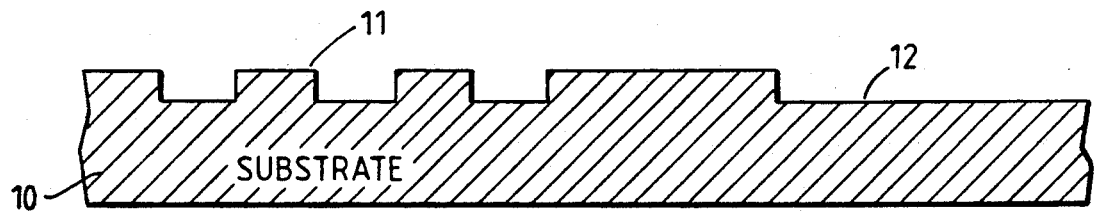
FIG. 1 shows the cross-section of a portion of a substrate containing trenches of different widths but of the same height.
Figure 8:
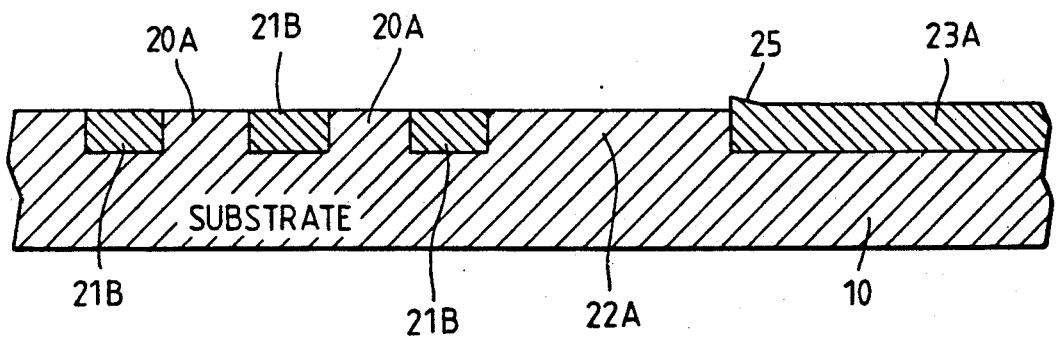
FIG. 8 depicts the structure of FIG. 7 after the nitride and oxide layers have been removed from the silicon substrate.

FIG. 1 shows a semiconductor substrate or wafer 10 which contains narrow active regions 20 separated by narrow shallow trenches 21 and a wide active region 22 between a narrow trench 21 and a wide trench 23. The surface geometry of the substrate 10 thus contains active areas 20 and 22 of near constant height which are separated by trenches of varying widths (horizontal distances) 21 and 23. When trenches such as 21 or 23 need to be formed in a silicon substrate, the ultimate objective usually is to fill the trenches with a dielectric material, which is generally silicon dioxide, so as to obtain a flat or planar substrate having isolation trenches as shown in FIG. 8. To obtain a planar surface, a series of processing steps are necessary, which are described by the method of this invention.

Figure 2:
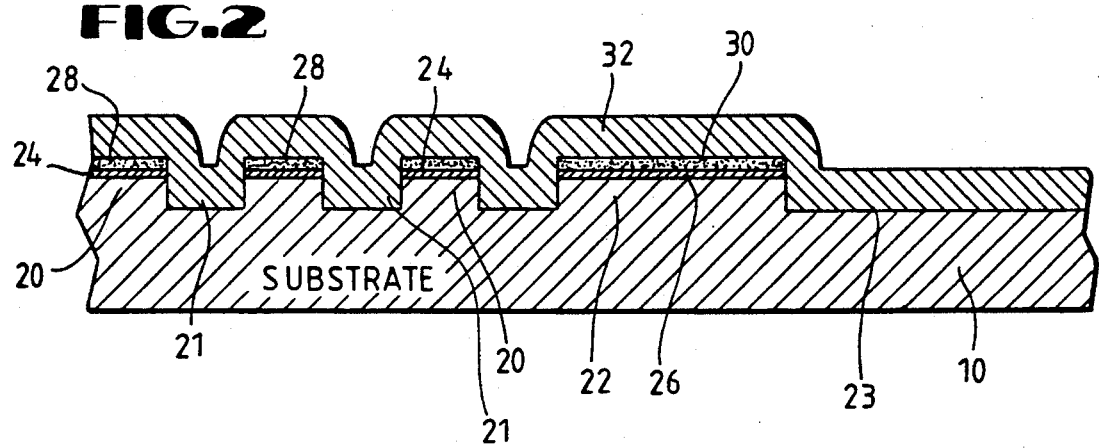
FIG. 2 depicts the structure of FIG. 1 after a conformal dielectric layer has been formed.

After appropriate cleaning steps, a conformal silicon dioxide layer 32 is formed as shown in FIG. 2, generally using chemical vapor deposition ("CVD") methods, which are well known in the art of making semiconductor devices. After the trenches 21 and 23 have been filled with conformal CVD oxide, the oxide must be removed from the active areas 20 and 22, but not from trench (field) regions 21 and 23. To accomplish this, it is first necessary to globally planarize the wafer 10 with a photoresist material and then simultaneously etch-back the photoresist and oxide from all active regions 20 and 22.

A conventional technique that has been used to planarize the surface of the substrate is to spin-on a photoresist layer on the entire wafer and then etch-back the resist layer and the CVD oxide layer 32 until the nitride layers 28 are exposed (the nitride layer 28 and oxide layer 26 having been formed by conventional techniques). However, this method does not provide a smooth or planar surface because the thickness of the photoresist layer is a function of the trench sizes. Larger trenches will not have adequate photoresist to protect them during the etchback. As the distance between the trenches increases, the spun-on film begins to cover the substrate in a conformal manner instead of planarizing it. Thus, for such wafers, effective planarization can generally not be achieved by this method.

Figure 3:
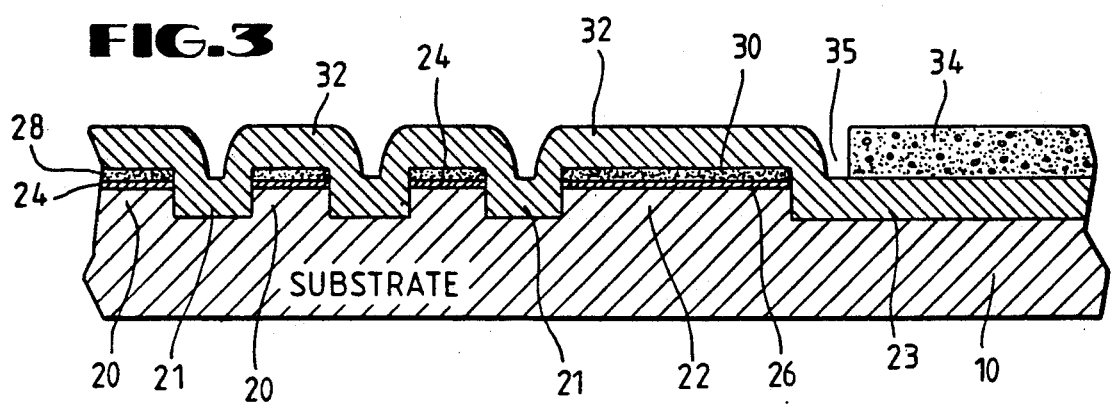
FIG. 3 depicts the structure of FIG. 2 after a block of a first resist layer (plug) has been formed only in the wide trenches.

To overcome some of the disadvantages of the above-described conventional planarization method, a first resist layer to form plugs 34, as shown in FIG. 3, has been used to fill in only the wide trenches before spinning-on a second photoresist layer on the entire wafer. Plugs 34 in the wide trenches may be formed by using a reverse tone slightly resized active area mask to pattern a photoresist layer such that photoresist plugs 34 are left in wide trenches 23. In most cases, the photoresist plug 34 thickness is made to be approximately equal to the combined step height produced by the pad oxide 24, nitride 28, and trench 23. However, when the trenches which receive resist plugs vary greatly in width, the plugs formed in narrower trenches are higher than the ones in the wider trenches. In these cases, the resist thickness in the wider trenches is made to be less than the combined height so that the plugs in the narrower trenches do not extend beyond the active regions 20 and 22.

The minimum size trench that will receive such a plug is determined by the lithography tool's alignment and resolution limitations as well as the thickness of the CVD oxide deposited on the trench side walls. It has been found that when some trenches exceed 30 microns in width and some are narrower, it is desirable to form lower height plugs in the trenches having greater than 30 micron width so that the plugs in the narrower trenches do not extend beyond the active regions.

The wafer of FIG. 3 is then baked between 180-200 degrees Celsius while being exposed to deep ultraviolet radiation (280-320 $\eta$m) to prevent intermixing of the plug with the planar resist to be formed during the next step, which is described in greater detail below.

Figure 4:
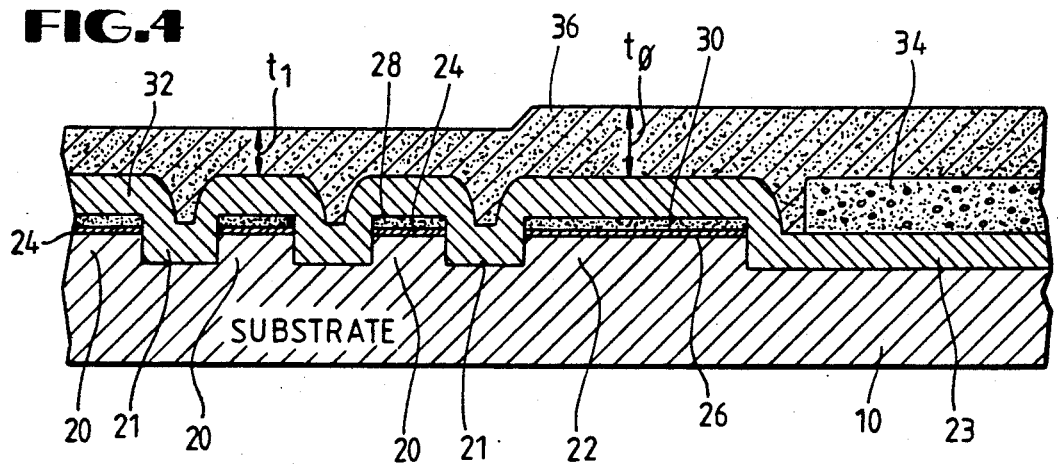
FIG. 4 depicts the structure of FIG. 3 after a second resist layer has been formed on the entire substrate.

Referring to FIG. 4, a second resist layer or coat 36 is applied on the wafer and then baked at temperature above 150 degrees Celsius. This planar resist layer is thick enough to locally planarize the critical topography of the wafer yet thin enough to have a low impact on the uniformity of the subsequent resist etch-back step. The critical topography includes the narrow gaps 36A between the oxide layers on the trench side wall and the resist plug 34, as well as areas in certain trenches 36B which are too narrow to receive resist plugs. Due to the physics of the resist coat process, the wafer does not get globally planarized at this stage. In fact, it has been found that the difference in the thickness of the second resist layer (i.e., the first planar resist coat) above narrow active regions 20 and wide active regions 22, i.e., $t_o - t_1 = \Delta t_1$, can exceed 2500 Angstroms. This thickness differential ($\Delta t_1$) will result in narrow trench arrays being overetched during the time it takes to remove all of the oxide on wide active regions. In the above example, the silicon dioxide in the narrow trench regions 21 will be overetched by over 2500 Angstroms.

Thus, use of the plug 34 and one planar layer 36 before etch-back does not provide the desired global planarization to enable one to obtain the planar substrate of FIG. 8. As noted earlier, obtaining uniform global planarization that is independent of the size and/or pattern density is highly desirable, especially for VLSIs which use small device geometries.

Figure 5:
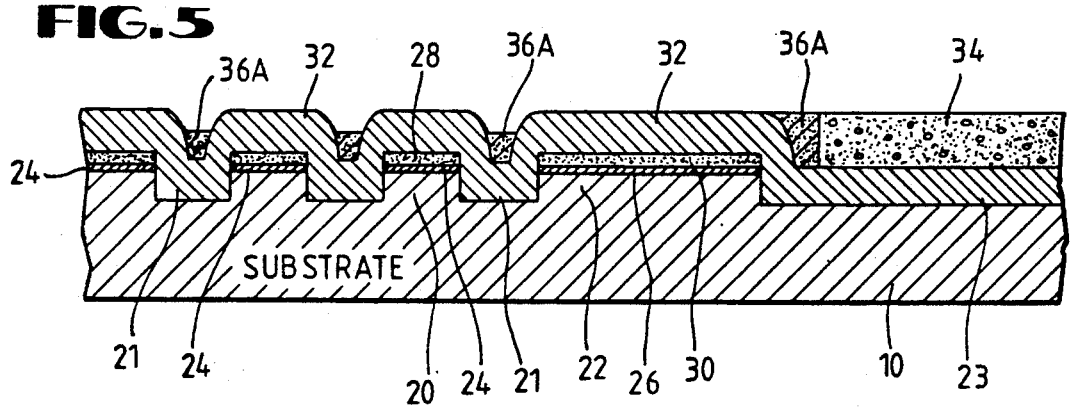
FIG. 5 depicts the structure of FIG. 4 after the etch-back of the second resist layer from the active regions.

To substantially reduce the $\Delta t_1$ to obtain a more uniform planar substrate surface, the photoresist 36 is etched back until the top of the plug 34, i.e., until all of the photoresist from the active regions 20 and 22 has been removed, as shown in FIG. 5. However, because the photoresist layer $t_1$ is thinner than $t_o$, the photoresist between narrow trenches 21 will be etched back below the surfaces of their respective adjoining CVD oxide layers 32, leaving photoresist 36B.

Figure 6:
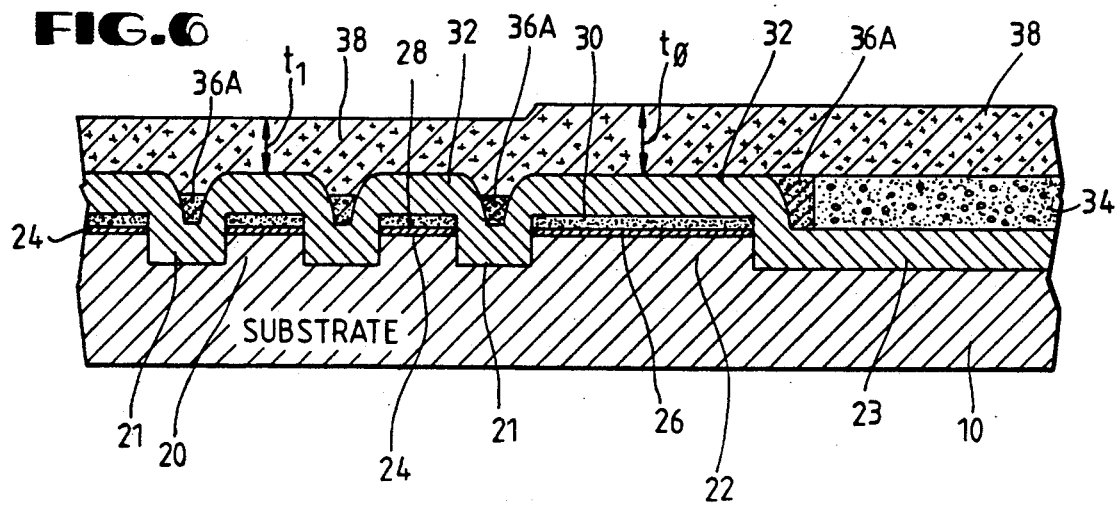
FIG. 6 depicts the structure of FIG. 5 after a third resist layer has been formed on the entire substrate.

Referring now to FIG. 6, a planar photoresist 38 (third resist layer) is formed over the substrate of FIG. 5. Because all of the gaps 36A and 36B between active areas 20, 22 have at least partially been filled with a photoresist by the first planarization and etch-back steps described above, as shown in FIG. 5, the third resist layer provides a near uniform or planar surface 40. Any photoresist thickness difference between wide and narrow gaps, i.e., $\Delta t_2 = t_3 - t_2$, has been determined to be less than one-half of $\Delta t_1$ which in many applications is of little or no consequence.

In some applications it may be desirable to further reduce the thickness differential $\Delta t_2$ before etching back the resist and the silicon dioxide. This may easily be accomplished by again repeating the steps described above for FIGS. 4-6. It will be obvious that successive repetition of steps shown in FIGS. 4-6 will reduce the thickness differential to nearly half of the previous level.

Figure 7:
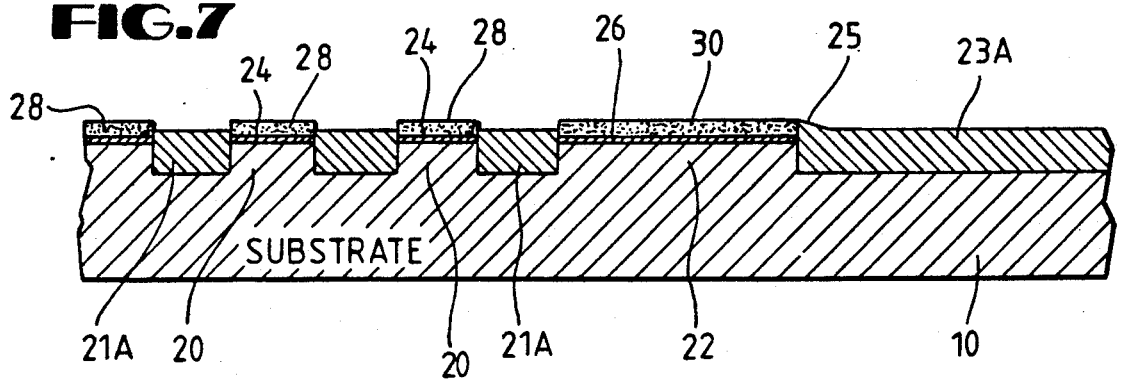
FIG. 7 depicts the substrate of FIG. 6 after etch-back of resist layers and the dielectric layer.

Referring now to FIG. 7, a photoresist etch-back is performed to remove the photoresist 38 until the surface of the CVD oxide 32 is reached. Using a multi-step reactive-ion etch in which the etch selectivity of the CVD oxide to photoresist is carefully controlled, the CVD oxide 32 is removed from the active regions 20 and 2 but maintained in the trench regions 21 and 23. The etch can be timed based on the thickness and etch rate of the layers or end pointed on the nitride layer using either laser interferometry or optical emission. Finally, the silicon and nitride layers 28 and 30, and initial oxide layers 24 and 26 are removed to obtain the planar substrate of FIG. 8, which contains narrow shallow trenches 21B, a wide shallow trench 23A, narrow active regions 20A and a wide active region 22A. The foregoing description has been directed to a particular method. It will be apparent, however, to those skilled in the art that many modifications and changes in the method set forth above will be possible without departing from the scope and spirit of the invention. It is intended that the following claims embrace all such modifications and changes.

What is claimed is:

1. A method of fabricating semiconductor devices on a silicon substrate comprising the steps of:
   (a) forming spaced apart trenches in a face of the silicon substrate, at least one trench being substantially wider than the remaining trenches, the regions in between the trenches at said face defining active regions;
   (b) forming a uniform conformal thick oxide layer on said face of the substrate to fill in the trenches with oxide and to form thick oxide layers over the active regions;
   (c) forming a first resist layer on said face only int he wider trench the first resist layer being nearly level with the thick oxide layer over said active regions;
   (d) forming a second resist layer on said face to completely cover the exposed thick oxide layer and first resist layer;
   (e) uniformly etching the second resist layer only until the second resist layer has been removed from the thick oxide layer over the active regions;
   (f) forming a third resist layer on said face over the entire substrate;
   (g) removing the first, second and third resist layers and the thick oxide layer from all of the active regions and from the remainder of the face to provide a planar surface at the face.

2. A method of fabricating semiconductor devices on a silicon substrate comprising the steps of:
   (a) forming spaced apart trenches in a face of the silicon substrate, at least one trench being substantially wider than the remaining trenches, the regions in between the trenches on said face defining active regions;
   (b) forming a uniform thick oxide layer on said face of the substrate to fill in the trenches with oxide and to form a thick oxide layer over the active regions;
   (c) forming a first resist layer on said face only int he wider trench substantially level with the thick oxide layer over the active regions;
   (d) forming a second resist layer over said face of the substrate to completely cover the exposed thick oxide layer and said first resist layer;
   (e) etching the second resist layer until the second resist layer has been removed from the thick oxide layer over the active regions;
   (f) forming a third resist layer over said face of the substrate to completely cover the exposed thick oxide layer and remaining parts of the first and second resist layers; and
   (g) removing the first, second and third resist layers from said face of the substrate and removing the thick oxide from the active regions, leaving said thick oxide in said trenches, to provide a planar surface.

3. A method of making an integrated circuit device, comprising the steps of:
   (a) forming trenches of varying width at a face of a semiconductor body;
   (b) forming a conformal coating on said face of a thickness at least as deep as said trenches;
   (c) forming a first coating of photoresist on said face in at least wider ones of said trenches, the depth of said first coating being substantially the same as the depth; of said trenches to leave exposed parts of said conformal coating between trenches;
   (d) forming a second coating of photoresist on said face over said exposed parts of said conformal coating and said first coating;
   (e) removing said second coating down to at least the level of said exposed parts of said conformal coating, leaving said first and second coatings in said trenches;
   (f) forming a third coating of photoresist on said face to cover said exposed parts of said conformal coating and the remaining first and second coatings;
   (g) removing said first, second and third coatings and said exposed parts of said conformal coating from said face, leaving said conformal coating in said trenches, to provide a planar surface at said face.

4. A method according to claim 3 wherein said semiconductor body is silicon.

5. A method according to claim 3 said planar surface at said face includes semiconductor regions for forming active devices.

6. A method according to claim 3 wherein said trenches are between metal lines on said face.

7. A method according to claim 3 wherein said conformal coating is silicon oxide.

8. A method according to claim 3 wherein said conformal coating is a dielectric material.

9. A method according to claim 3 wherein said first coating is treated prior to forming said second coating to reduce intermixing of said first and second coatings.

10. A method according to claim 3 wherein said step of removing said second coating includes removing said second coating to a level below that of said exposed parts of said conformal coating.

* * * * *

UNITED STATES PATENT AND TRADEMARK OFFICE
CERTIFICATE OF CORRECTION

PATENT NO.   : 5,077,234
DATED        : Dec. 31, 1991
INVENTOR(S)  : Scoopo et al.

It is certified that error appears in the above-identified patent and that said Letters Patent is hereby corrected as shown below:

Column 1, line 52, change "2" to --23--.

Column 2, line 22, change "ma" to --may--.

Column 5, line 9, change "2" to --22--.

Column 5, line 38, change "int he" to --in the--.

Column 6, line 1, change "int he" to --in the--.

Signed and Sealed this

Fifteenth Day of June, 1993

Attest:

MICHAEL K. KIRK

Attesting Officer

Acting Commissioner of Patents and Trademarks